United States Patent
Chen et al.

(10) Patent No.: US 7,781,878 B2
(45) Date of Patent: Aug. 24, 2010

(54) ZIGZAG-STACKED PACKAGE STRUCTURE

(75) Inventors: Yu-Ren Chen, Hsinchu (TW);
Yeong-Jyh Lin, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 112 days.

(21) Appl. No.: 12/017,014

(22) Filed: Jan. 19, 2008

(65) Prior Publication Data

US 2008/0174000 A1    Jul. 24, 2008

(30) Foreign Application Priority Data

Jan. 19, 2007    (TW) .............................. 96102091 A

(51) Int. Cl.
*H01L 23/02*    (2006.01)
*H01L 23/48*    (2006.01)
*H01L 23/52*    (2006.01)
*H01L 29/40*    (2006.01)

(52) U.S. Cl. ............... 257/686; 257/777; 257/E25.006; 257/E25.013; 257/676

(58) Field of Classification Search ................. 257/686, 257/723, 777, 676
See application file for complete search history.

(56) References Cited

U.S. PATENT DOCUMENTS

| | | | |
|---|---|---|---|
| 6,337,521 B1 * | 1/2002 | Masuda | 257/777 |
| 6,353,265 B1 * | 3/2002 | Michii | 257/777 |
| 6,376,904 B1 * | 4/2002 | Haba et al. | 257/686 |
| 6,433,421 B2 * | 8/2002 | Masuda et al. | 257/723 |
| 6,437,427 B1 | 8/2002 | Choi | |
| 6,476,474 B1 * | 11/2002 | Hung | 257/686 |
| 6,677,665 B2 * | 1/2004 | Huang | 257/676 |
| 6,847,105 B2 * | 1/2005 | Koopmans | 257/686 |
| 7,170,160 B1 | 1/2007 | Wang | |
| 7,352,057 B2 | 4/2008 | Grafe et al. | |
| 2002/0045290 A1 * | 4/2002 | Ball | 438/106 |
| 2005/0029645 A1 * | 2/2005 | Mess et al. | 257/686 |
| 2005/0110127 A1 * | 5/2005 | Kanemoto et al. | 257/686 |
| 2006/0267173 A1 * | 11/2006 | Takiar et al. | 257/686 |

* cited by examiner

*Primary Examiner*—Leonardo Andújar
*Assistant Examiner*—Teresa M Arroyo
(74) *Attorney, Agent, or Firm*—Ming Chow Sinorica, LLC

(57) ABSTRACT

A die-stacked package structure, wherein a plurality of dies are stacked on the substrate with a rotation so that a plurality of metallic ends and the metal pad on each die on the substrate can all be exposed; a plurality of metal wires are provided for electrically connecting the plurality of metal pads on the plurality of dies with the plurality metallic ends on the substrate in one wire bonding process; then an encapsulate is provided for covering the plurality of stacked dies, a plurality of metal wires and the plurality of metallic ends on the substrate.

10 Claims, 13 Drawing Sheets

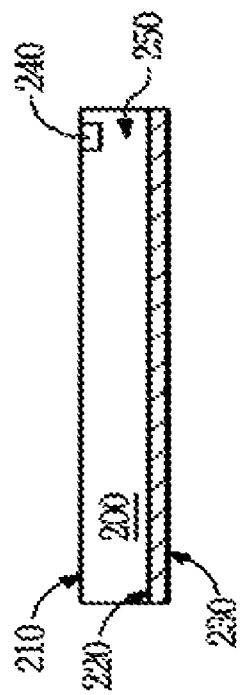
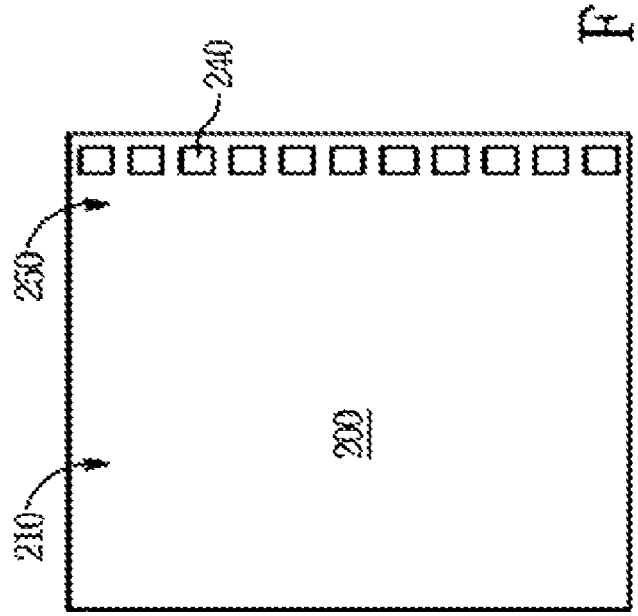
FIG. 2B
FIG. 2A

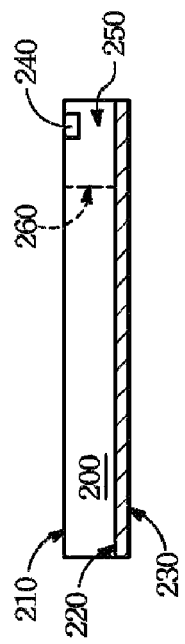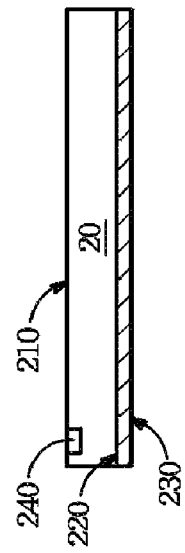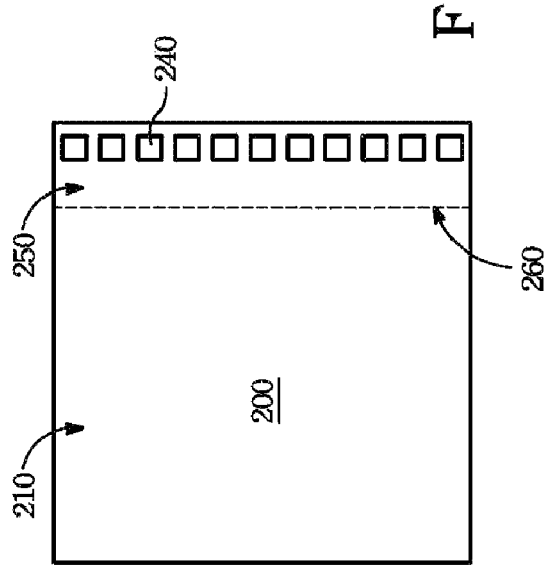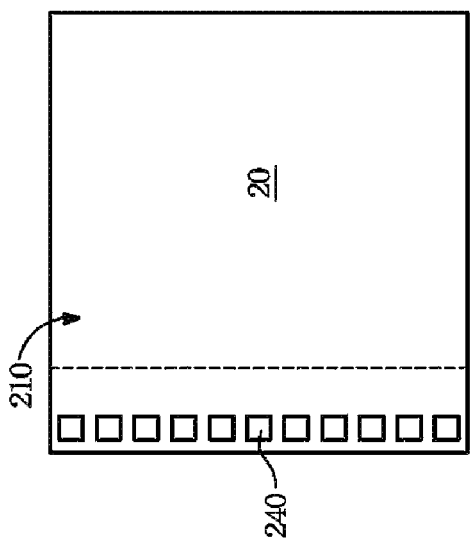
FIG. 2B
FIG. 2D
FIG. 2A
FIG. 2C

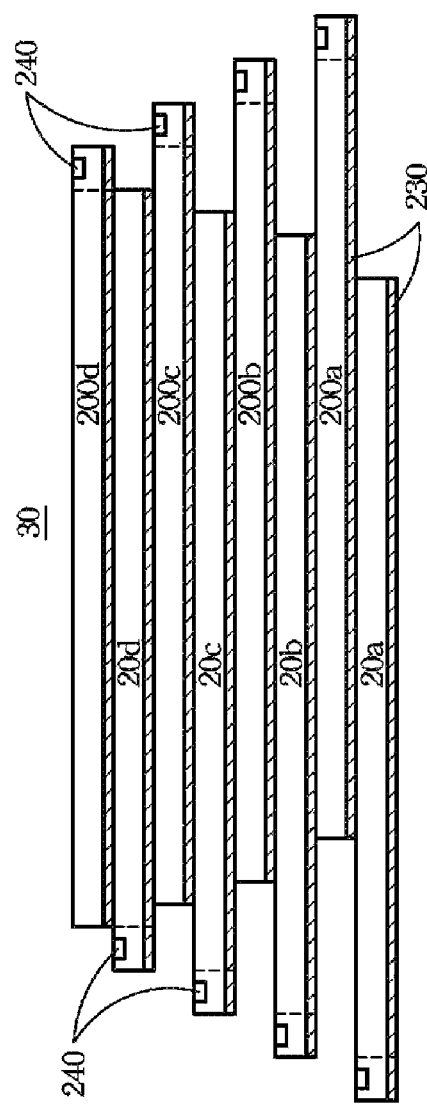
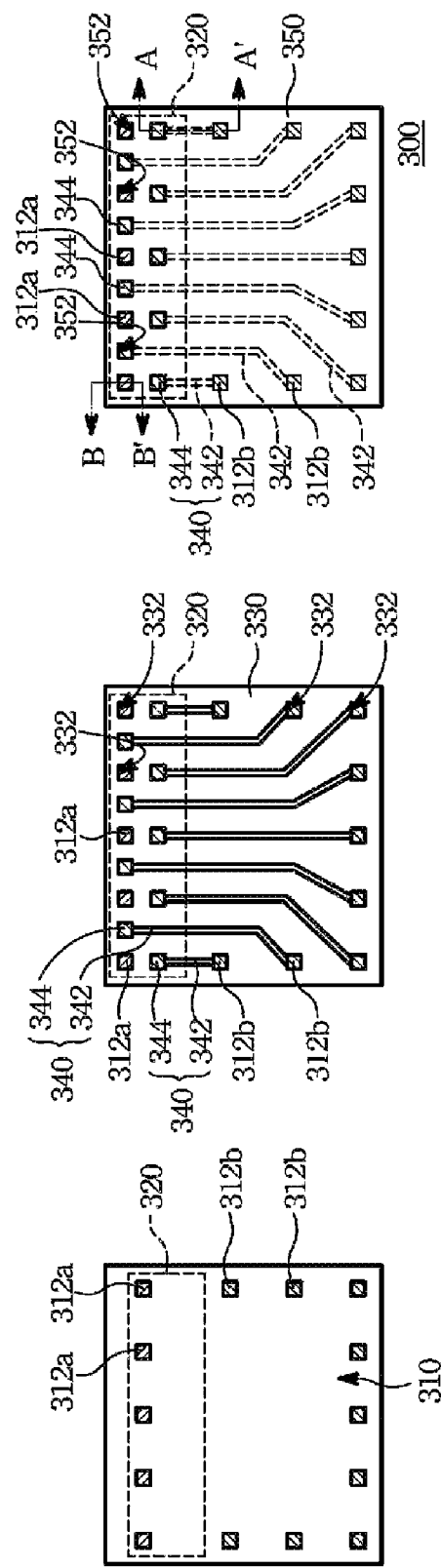
FIG. 2E
FIG. 3A
FIG. 3B
FIG. 3C

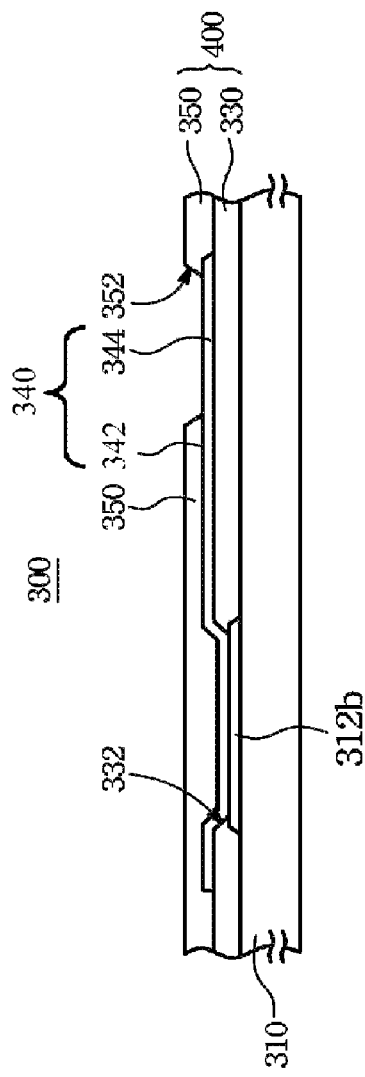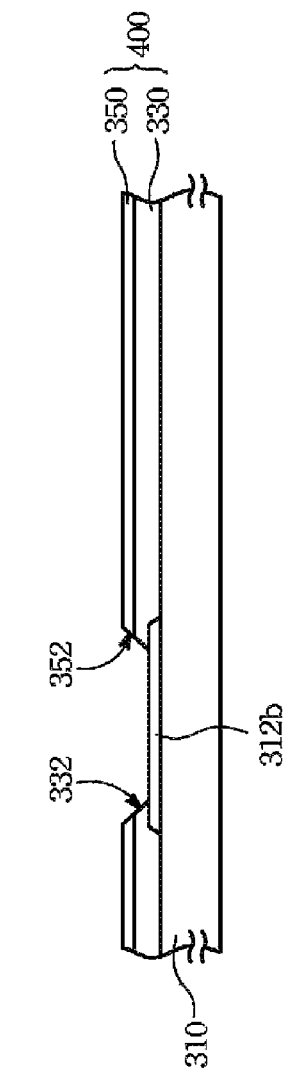

ZIGZAG-STACKED PACKAGE STRUCTURE

BACKGROUND OF THE INVENTION

1. Field of the Invention

The present invention is a multi-dies stacked package structure, more particularly; it is a zigzag-stacked package structure.

2. Description of the Prior Art

In recent years, the semiconductor package process is using three-dimension (3D) package method to have relative large integrated semiconductor or the volume of the memory in the less measure of area. In order to achieve this object, the die stacked method is used to have 3D package structure.

In the prior art, the stacked structures of the dies are formed by stacking a plurality of dies one another and on a substrate and wire bonding the dies and the substrate for electrical connection. FIG. 1a is a sectional view showing a zigzag-stacked package structure with the dies of a similar size in the prior art. As shown in FIG. 1a, the zigzag-stacked package structure 100 includes a circuit substrate 110, dies 120a and 120b, a spacer 130, a plurality of wires 140 and an encapsulated material 150. The circuit substrate 110 includes a plurality of pads and the die 120a and die 120b respectively includes a plurality of pads 122a and 122b. The pads 122a and 122b are arranged around the periphery areas of the die 120a and 120b respectively. The die 120a is disposed on the circuit substrate 110 and the die 120b is disposed on top of the die 120a with the spacer 130 placed therebetween. The wires 140 connect the pads 112 on the circuit substrate 110 with the pads 122a and 122b by wire bonding process and the dies 120a and 120b are then electrically connected to the circuit substrate 110. The encapsulated material 150 is formed on the circuit substrate 110 to cover the wires 140, the dies 120a and 120b.

Because the pads 122a and 122b are arranged on the periphery areas of the dies 120a and 120b, the die 120a is not able to directly support the die 120b. So, in the package process, after the die 120a is connected to the circuit substrate 110, the pads 122a on the die 120a are connected to the pads 112 on the circuit substrate 110 by a wire bonding process. The spacer 130 is then connected to the die 120a and the die 120b is connected on the spacer 130. The pads 122b on the die 120b are connected to the pads 112 on the circuit substrate 110 by another wire bonding process. Obviously, the spacer 130 is disposed between the die 120a and 120b to provide a distance between the die 120a and 120b for the wires 140. However, the usage of the spacer 130 causes the difficulty to reduce the thickness of the zigzag-stacked package structure 100.

Besides, another zigzag-stacked package structure with different die sizes is provided in prior art, as the sectional view shown in FIG. 1B. The zigzag-stacked package structure 10 includes a circuit substrate 110, die 120c, die 120d, a plurality of wires 140 and an encapsulated material 150. The circuit substrate 110 includes a plurality of pads 112. The size of the die 120c is bigger than the size of the die 120d. The dies 120c and 120d respectively include a plurality of pads 122c and 122d. The pads 122c and 122d are arranged on the periphery areas of the dies 120c and 120d. The die 120c is disposed on the circuit substrate 110 and the die 120d is disposed on the die 120c. The wires 140 connect the pads 112 with the pads 122c by wire bonding process and the die 120c is then electrically connected to the circuit substrate 110. The wires 140 connect the pads 112 with the pads 122d by wire bonding process and the die 120d is then electrically connected to the circuit substrate 110. The encapsulated material 150 is formed on the circuit substrate 110 to cover the wires 140, the dies 120c and 120d.

Because the die 120d is smaller than the die 120c, the die 120d does not completely cover the die 120c when the die 120d is disposed on the die 120c. Therefore, the package process is different to the process in FIG. 1A. Both of the dies 120c and 120d are mounted on the substrate 110 first and then a one-time wire bonding process is then executed. When the dies with different sizes are stacked together to form a zigzag-stacked package structure in prior art, the sizes of the dies on top should be gradually smaller; therefore, the number of the dies to be stacked is limited.

According to the two stacked structures described above, the design and the usage of the dies are limited. According to the problems above, U.S. Pat. Nos. 6,252,305, 6,359,340 and 6,461,897 provide another zigzag-stacked package structure, as shown in FIG. 1C. Obviously, the package structure uses the dies with the same size but no spacer 130 to separate the dies. However, during the stacking steps, the dies are stacked to each other by using at least two types of pad arrangement. For example, the pads on the first dies are disposed on one side of the first dies and the pads on the second dies are disposed on two adjacent sides. Besides, the package structure needs the wire bonding process to be executed in two directions. Therefore, as the structure shown in FIG. 1C, it would increase the time of wire bonding process and it would cause asymmetrical molding flow during the molding process. The wire in one direction may be hit by the transversal molding strength causing the contact of the wires and further the malfunction of the dies.

Besides, U.S. Pat. No. 6,900,528, U.S. Pat. No. 20030137042A1, U.S. Pat. No. 20050029645A1 and U.S. Pat. No. 20060267173A1 disclosed another zigzag-stacked package structure. Obviously, the height between the dies is used to replace the spacer to increase the density of the package structure. However, there are some problems in the manufacture of the package structure. After two dies are connected together, the first wire bonding process shall be proceeded before another dies can be stacked upon. When the number of dies is increased, the package process become more time-consuming and more complicated.

SUMMARY OF THE INVENTION

According to the drawbacks and the problems of prior art described above, a zigzag-stacked package structure is provided in the present invention for stacking of the dies with similar size in a three-dimension package structure.

The main object of the present invention is to provide a zigzag-stacked package structure with higher package density and thinner thickness.

Another object of the present invention is to provide a zigzag-stacked package structure with balanced molding effect during the molding process.

Another object of the present invention is to provide a zigzag-stacked package structure including a bus bar to have better flexibility of circuit design and higher reliability.

According to the objects described above, the present invention provides a zigzag-stacked package structure. The zigzag-stacked package structure includes a lead frame, a zigzag-stacked structure and an encapsulated material. The lead frame includes a plurality of inner leads, a plurality of outer leads and a die paddle, wherein the die paddle is disposed between the inner leads and a height difference formed between the die paddle and the inner leads. The zigzag-stacked structure is connected on the die paddle and the zigzag-stacked structure includes a plurality of first dies and a plurality of second dies, each of the first dies and the second dies having an active surface and a back surface opposite to the active surface, a first periphery region and a second periphery region opposite to the first periphery region defined upon each of the active surfaces, each of the first dies and each of the second dies alternately stacked to each other with the back surface attached to the active surface and forming a stacked area, and the first dies and the second dies are electrically connected to the inner leads. The encapsulated material covers the zigzag-stacked structure and the lead frame, and the outer leads are extended over the encapsulated material. Each of the first dies having a plurality of pads disposed on the first periphery region and each of the second dies having a plurality of pads disposed on the second periphery region, each of the pads is exposed and unshadowed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A and 2C are top views of the die structure in the present invention.

FIGS. 2B and 2D are sectional views of the die structure in the present invention.

FIG. 2E is a section view of a zigzag-stacked structure in the present invention.

FIGS. 3A~3C are views of manufacturing steps of a redistribution layer in the present invention.

FIGS. 4A~4B are section views of the redistribution layer in the present invention.

DESCRIPTION OF THE PREFERRED EMBODIMENT

Figure 1B:
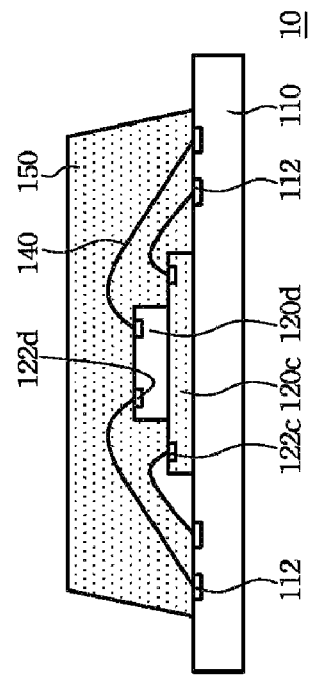
FIGS. 1A~1D are views in prior art.
Figure 1A:
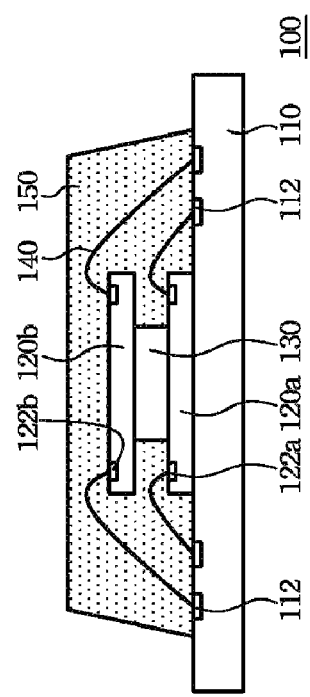
Figure 1D:
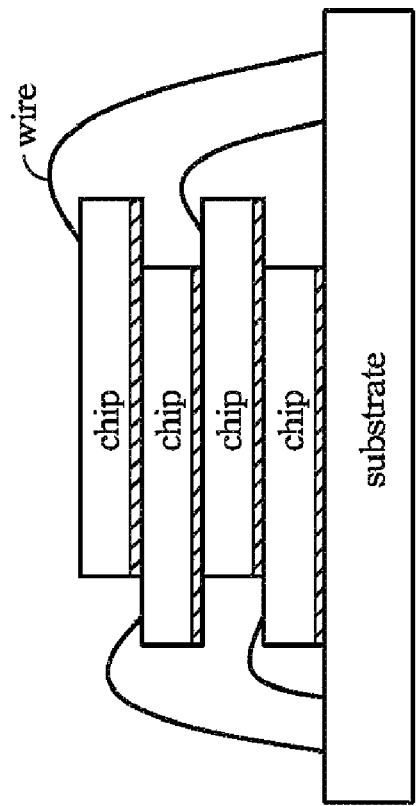
Figure 1C:
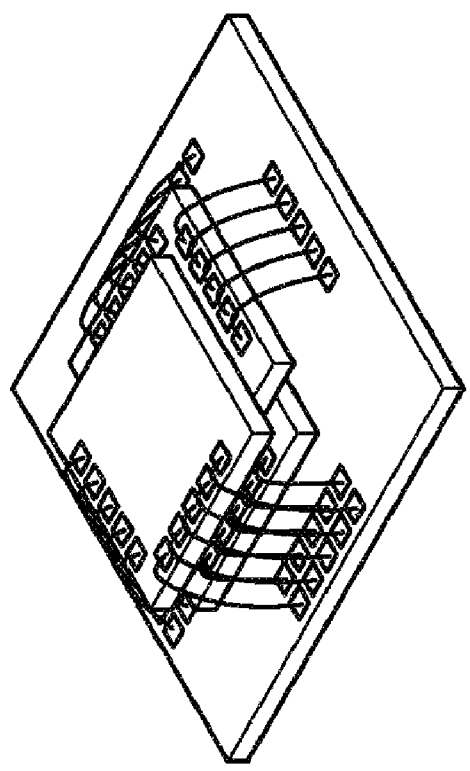

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

The semiconductor package structure in these years is to package a wafer in front end process to do the thinning execution. The thinning process is to grind the die with the size between 2 ~20 mils and then do the process of coating or printing a polymer on the back surface of the die. The material of polymer is a resin, such as a B-Stage resin. After a baking or photo-lighting process, the polymer becomes a sticky adhesive. After the baking process, a removable tape is stuck on the polymer. A singulation process is performed to cut the wafer into a plurality of dies. Each of the individual dies can then be vertically stacked together and as a whole connected to the substrate to form a chip stacked package.

First, please refer to FIG. 2A to FIG. 2D. FIGS. 2A, 2C and FIGS. 2B, 2D are plan views and sectional views of dies 200 and 20 respectively shown in previous description. As shown in FIG. 2A to FIG. 2D, each of the die 200, 20 includes an active surface 210 and a back surface 220 opposite to the active surface 210. There is an adhesive layer 230 formed on the back surface 220 of the die 200.

The adhesive layer 230 is used to attach the lead frame and the dies 200 and 20. Therefore, any adhesive material which can meet the purpose, such as die attached film, is included in the present invention. Besides, in the embodiment of the present invention, there are a plurality of pads 240 disposed on a periphery region 250 of the active surfaces 210 of the dies 200 and 20 When the die 200 is stacked on the die 20, they are arranged to have the pads 240 of the die 20 and the pads 240 of the die 200 to locate on two opposite sides and to form a stacked area, as shown in FIG. 2E. Therefore, a zigzag-stacked structure 30 can then be formed by alternately stacking each of the dies 200 and 20 Before the zigzag-stacked structure 30 is formed in the present invention, the stacked areas between the dies are determined based on the number of the dies to be stacked. For example, the two dies 20a and 200a on the bottom layer are connected to each other by the adhesive layer 230, the dimension of the stacked area formed by the die 20a and the die 200a is larger than a half of the dimension of the dies 20a and 200a, and the dimension of the stacked area formed by the 20b and the die 200a is larger than that of the stacked area formed by the die 200a and the die 20a, so that the stacked areas formed by the dies 20a, 200a, 20b, 200b, 20c, 200c, 20d and 200d respectively are upwardly increasing Therefore, a step-like die stacked structure is formed and each of the pads 240 disposed on the dies 20a, 200a, 20b, 200b, 20c, 200c, 20d and 200d are unshadowed by any of the top dies. In an embodiment, the size of the dies 20 and 200 is about 10 mm * 13 mm * 75 um and the thickness of the adhesive layer 230 on the back surface of the die is about 60 um. The thickness of the substrate used to support the zigzag-stacked structure is about 200 um~250 um. According to the size of the dies 20 and 200, the biggest overhang width of the zigzag-stacked structure is about 1 mm for a six die stacked structure and less than 1.5 mm for an eight die stacked structure. It should be noted that the size of the dies is not limited to the above. As long as the zigzag-stacked structure is formed according to the description above is included in the present invention.

An embodiment of the present invention for a die 200 or a die 20 including a plurality of pads disposed thereon and a redistribution layer (RDL) to rearrange some of the pads of the die to one periphery region on the active surface of the die is described in the following.

FIGS. 3A ~3C are plan views showing the manufactureing steps of the redistribution layer on the die in the present invention. As shown in FIG. 3A, a die body 310 is provided and a wire bonding region 320 is defined in one periphery region on the die body 310. The pads 312 are disposed on the die body 310 and comprise a plurality of first pads 312a and a plurality of second pads 312b. The first pads 312a are disposed within the wire bonding region 320 and the second pads 312b are disposed outside of the wire bonding region 320. Referring to FIG. 3B, there is a first protective layer 330 formed on the die body 310 and the first protective layer 330 includes a plurality of first openings 332 to expose the first pads 312a and the second pads 312b. Then, a redistribution layer 340 is formed on the first protective layer 330. The redistribution layer 340 includes a plurality of traces 342 and a plurality of third pads 344. The third pads 344 are disposed within the wire bonding region 320 and the traces 342 are extended from the second pads 312b to the corresponding third pads 344. The second pads 312b are electrically connected to the third pads 344. Besides, the material of the redistribution layer 340 can be gold, copper, nickel, titanium tungsten, titanium and any other conductive metals. Now referring to FIG. 3C, after forming the redistribution layer 340, a second protective layer 350 is formed on the die body 310 to cover the redistribution layer 340 and the second pads 312b to form the structure of the die 300. The second protective layer 350 includes a plurality of second openings 352 to expose the first pads 312a and the third pads 344.

It should be noted that the first pads 312a and the second pads 312b are arranged on the active surface of the die body 310 in periphery. The first pads 312a and the second pads 312b also can be arranged on the active surface of the die body 310 in array or any other different types. The second pads 312b are electrically connected to the third pads 344 by traces 342. Besides, the arrangement of the third pads 344 is not limited in the present embodiment. Although the third pads and the first pads 312a in FIG. 3B are arranged in two lines and on one periphery region of the die body 310. The third pads 344 and the first pads 312a can also be arranged in single line, multiple lines or any other types within the wire bonding region 320.

FIGS. 4A and 4B are sectional views according to the sectional line A-A' and B-B' in FIG. 3C. As described above for FIG. 3C, the die 300 includes the die body 310 and the redistribution structure 400. The redistribution structure 400 is composed of the first protective layer 330, the redistribution layer 340 and the second protective layer 350. The die body 310 includes the wire bonding region 320 and the wire bonding region 320 is defined in one periphery region of the die body 310. Besides, the first pads 312a are disposed within the wire bonding regions 320 and the second pads 312b are disposed outside of the wire bonding region 320.

The first protective layer 330 is disposed on the die body 310 and includes a plurality of first openings 332 to expose the first pads 312a and the second pads 312b. The redistribution layer 340 is disposed on the first protective layer 330 and extended from the second pads 312b to the wire bonding regions 320. The redistribution layer 340 includes a plurality of traces 342 and a plurality of third pads 344 disposed within the wire bonding region 320. The second protective payer 350 is formed to cover the redistribution layer 340 and the second pads 312b and includes a plurality of second openings 352 to expose the first pads 312a and the third pads 344.

Figure 5:
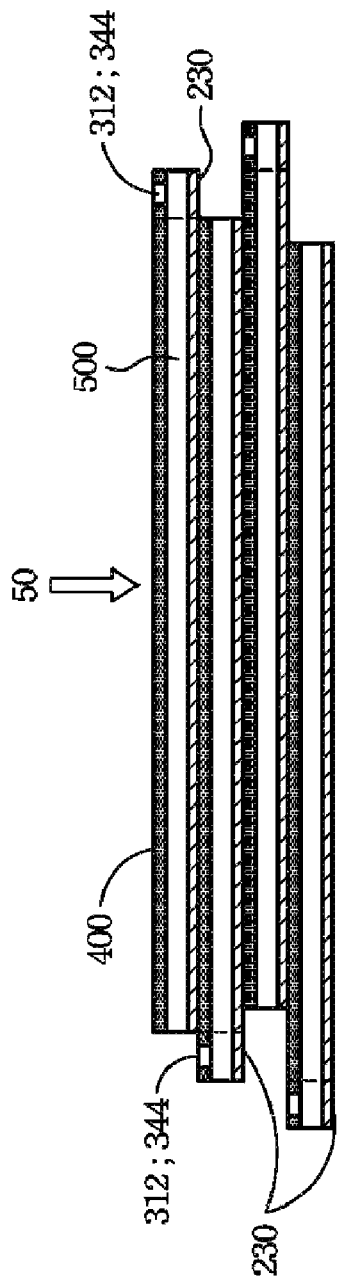
FIG. 5 is a sectional view of a zigzag-stacked structure with a redistribution layer in the present invention.

FIG. 5 is a view showing a zigzag-stacked structure in the present invention. The zigzag-stacked structure 50 is composed by stacking a plurality of dies 500. For example, there are four dies stacked to each other and each of the dies includes a redistribution structure 400. Therefore, the pads 312 and 344 on the dies 500 are disposed in the wire bonding region 320 of the dies 500 to form the zigzag-stacked structure 50. The stacking method of the zigzag-stacked structure 50 is the same as the zigzag-stacked structure 30 described above; hence, the detailed description is omitted. Besides, an adhesive layer 230, such as polymer, is used to connect the dies 500 and form the zigzag-stacked structure.

Figure 6:
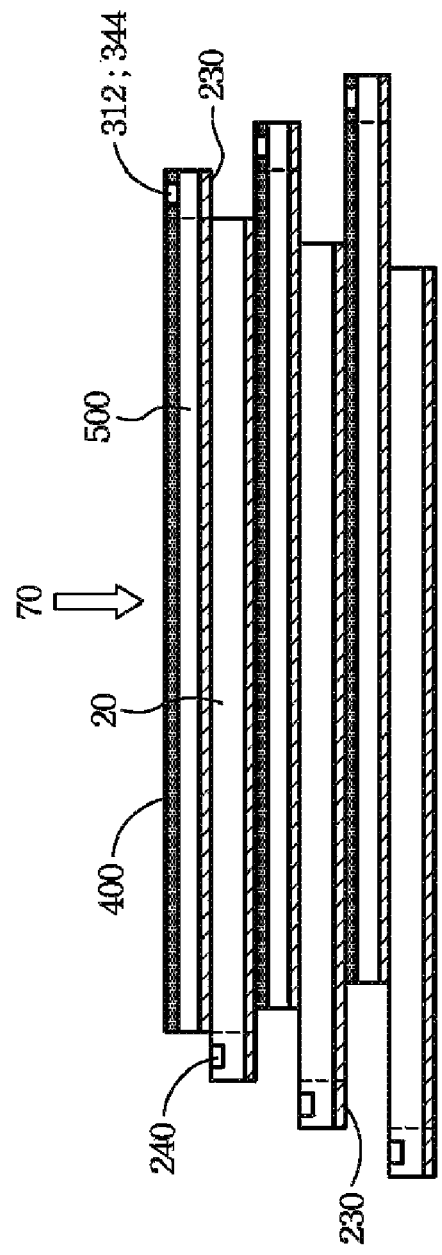
FIG. 6 is a sectional view of a zigzag-stacked structure in another embodiment of the present invention.

Besides the zigzag-stacked structures 30 and 50 in the present invention described above, the dies 500 with the redistribution structure 400 can be stacked on the dies 20 without the redistribution structure alternately to form another kind of the zigzag-stacked structure 70. As shown in FIG. 6, there are six dies stacked together. Because the stacking method of the zigzag-stacked structure 70 is the same as the stacked method of the zigzag-stacked structures 30 and 50, the detailed description is omitted. Also, it should be noted that the number of dies to form the zigzag-stacked structure is not limited in the present invention. For example, there are four dies stacked together as shown in FIG. 5 and there are six dies stacked together as shown in FIG. 6. It can be other kinds of compositions to form the zigzag-stacked structure by satisfying the description above in the present invention.

Figure 7:
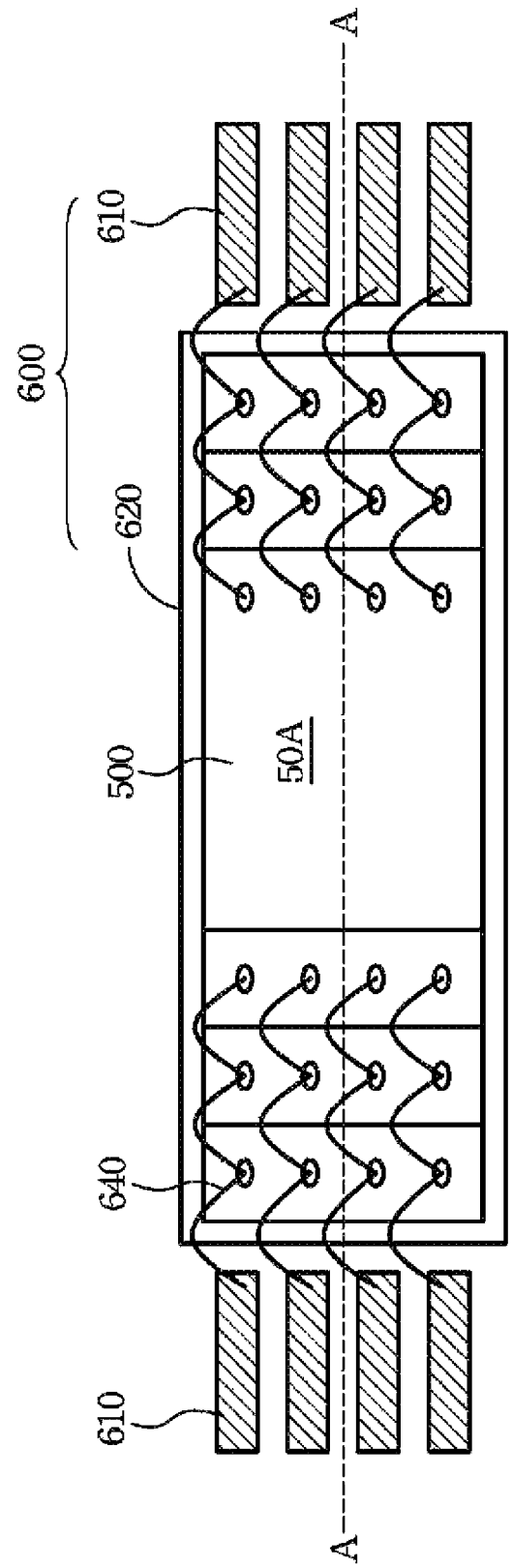
FIG. 7 is a top view of a zigzag-stacked structure in the present invention.

FIG. 7 is a plan view showing the zigzag-stacked package structure in the present invention. As shown in FIG. 7, the zigzag-stacked package structure includes a lead frame 600 and a zigzag-stacked structure 50A. The lead frame 600 includes a plurality of inner leads 610, a plurality of outer leads (not shown) and a die paddle 620. The die paddle 620 is disposed between the corresponding inner leads 610. There is a height difference formed between the inner leads 610 and the die paddle 620. In this embodiment, the zigzag-stacked structure 50A is disposed and connected on the die paddle 620 by an adhesive layer 230. The adhesive layer 230 in the present invention is a sticky adhesive as described above but not limited to. The adhesive layer 230 is used to connect the zigzag-stacked structure 50A and the die paddle 620. Therefore, any adhesive material which can meet the purpose, such as die attached film, is included in the present invention. It should be noted that, in the real package process, there are two ways to form the zigzag-stacked package structure. One is to form the stacked structure of a plurality of dies first and then connect the stacked structure to the lead frame. The other is to connect a die to the lead frame and then sequentially stack the other dies one after another. No matter what kind of the package method to form the zigzag-stacked structure 50A, the wires 640 are used to electrically connect the zigzag-stacked structure 50A to the inner leads 610 of the lead frame 600 after stacking the dies. Obviously, the zigzag-stacked package structure in the present invention is to connect the dies and the lead frame first and then do the wire bonding process to simplify the package procedure. It should be noted that the pads disposed on the dies are unshadowed by the top die in each of the zigzag-stacked structures in the present invention. Therefore, the dies are able to connect to the lead frame and then do the wire bonding process. Because the wire bonding procedure is well known by a person of ordinary skill in this art, the detailed description is omitted.

Figure 8:
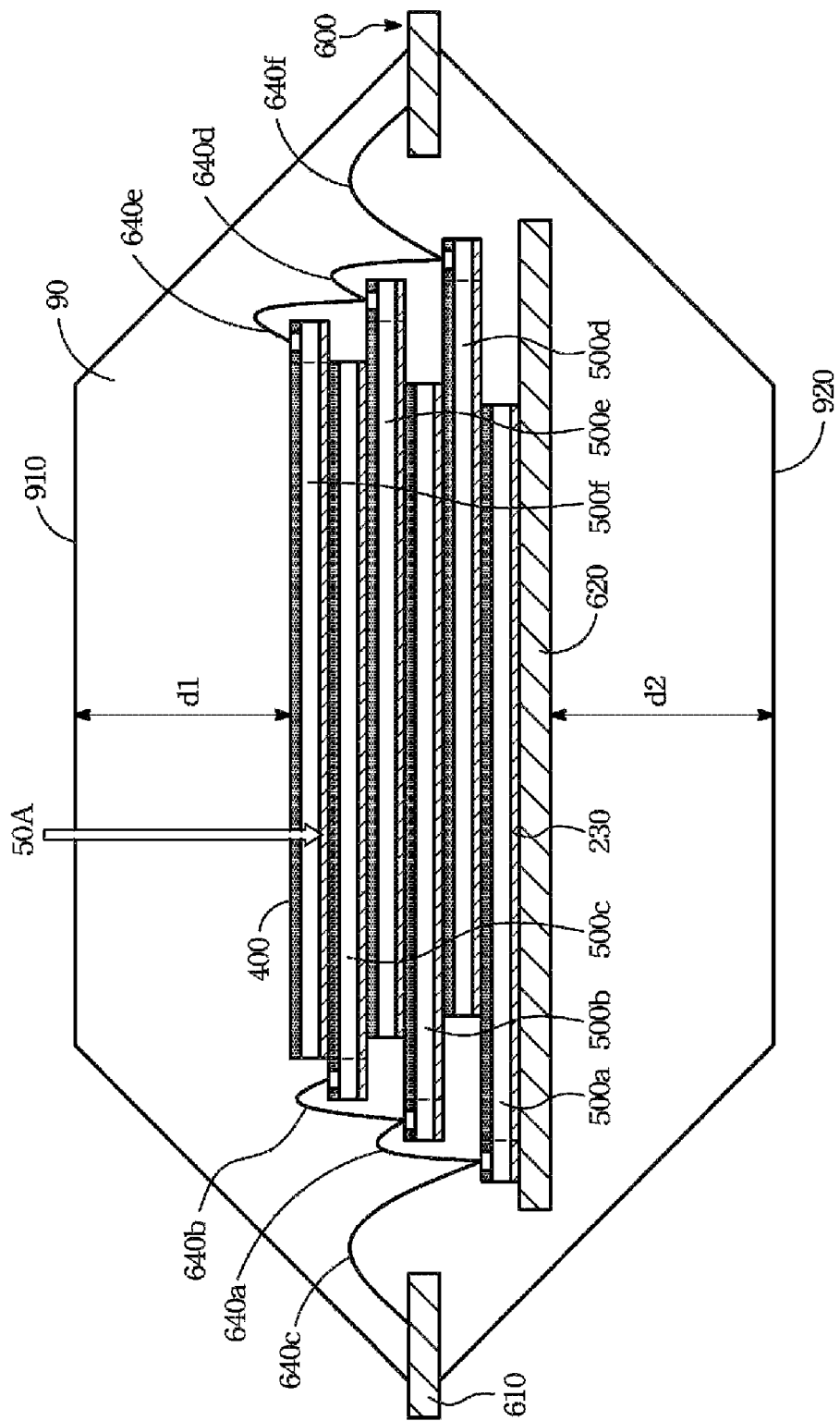
FIG. 8 is a sectional view of a zigzag-stacked package structure in the present invention.

FIG. 8 is a sectional view showing a zigzag-stacked package structure in the present invention (according to the sectional line AA in FIG. 7). As shown in FIG. 8, the lead frame 600 is connected with six dies 500 to form the zigzag-stacked package structure and is connected by a plurality of wires 640. The lead frame 600 includes a plurality of corresponding inner leads 610, a plurality of outer leads (not shown) and a die paddle 620. The die paddle 620 is disposed between the corresponding inner leads 610 and a height difference is formed between the die paddle 620 and the inner leads 610. One end of the wire 640a is connected to the pad of the die 500a. And the other end of the wire 640a is connected to the pad of the die 500b. Then, the wire 640b connects the pad of the die 500b with the pad of the die 500c. The wire 640c to then electrically connects the pad of the die 500a with the corresponding inner lead 610 of the lead frame 600. The steps described above are repeated to connect the dies 500*d*, 500*e* and 500*f* by the wires 640*d* and 640*e*. Finally, the die 500*d* is electrically connected to the corresponding inner leads 610 of the lead frame by the wire 640*f*. Therefore, the dies 500*a*, 500*b*, 500*c*, 500*d*, 500*e* and 500*f* are connected to the lead frame 600 by the wires 640*a*, 640*b*, 640*c*, 640*d*, 640*e* and 640*f*. The material of the wires 640 is gold but not limited to. Obviously, the method to form the zigzag-stacked package structure in the present invention is to connect the dies and the lead frame first and then do the wire bonding process to simplify the package procedures.

The molding process is used to form the encapsulated material 90 to cover the zigzag-stacked structure 50A, the inner leads 610 and the die paddle 620 of the lead frame 600. The molding process is done by a mold, so the molding flow is able to flow into from the two sides of the inner leads. Since the zigzag-stacked structures 30, 50, 50A and 70 are stacked in a zigzag manner, it is able to form a symmetrical structure, even though the number of dies is different, such as the zigzag-stacked structure 30 formed by eight dies 200 and 20, the zigzag-stacked structure 50 formed by four dies 500 and the zigzag-stacked structure 70 formed by six dies. Therefore, when the molding flows into the mold, it balances the molding flow in the two sides of the inner leads. The zigzag-stacked package structure is able to have a very good reliability. Besides, by configuring the inner leads 610 and the die paddle 620 of the lead frame 600 in the present invention, the vertical distance (d1) between the top edge surface 910 of the encapsulated material 90 and the die 500*f* and the vertical distance (d2) between the bottom edge of the die paddle 620 and the bottom edge of the encapsulated material 90 can be similar. When the molding process is in proceeding, the molding flow on the die 500*f* and the bottom of the die paddle 620 are the same to form the balanced package structure in this embodiment.

Figure 9:
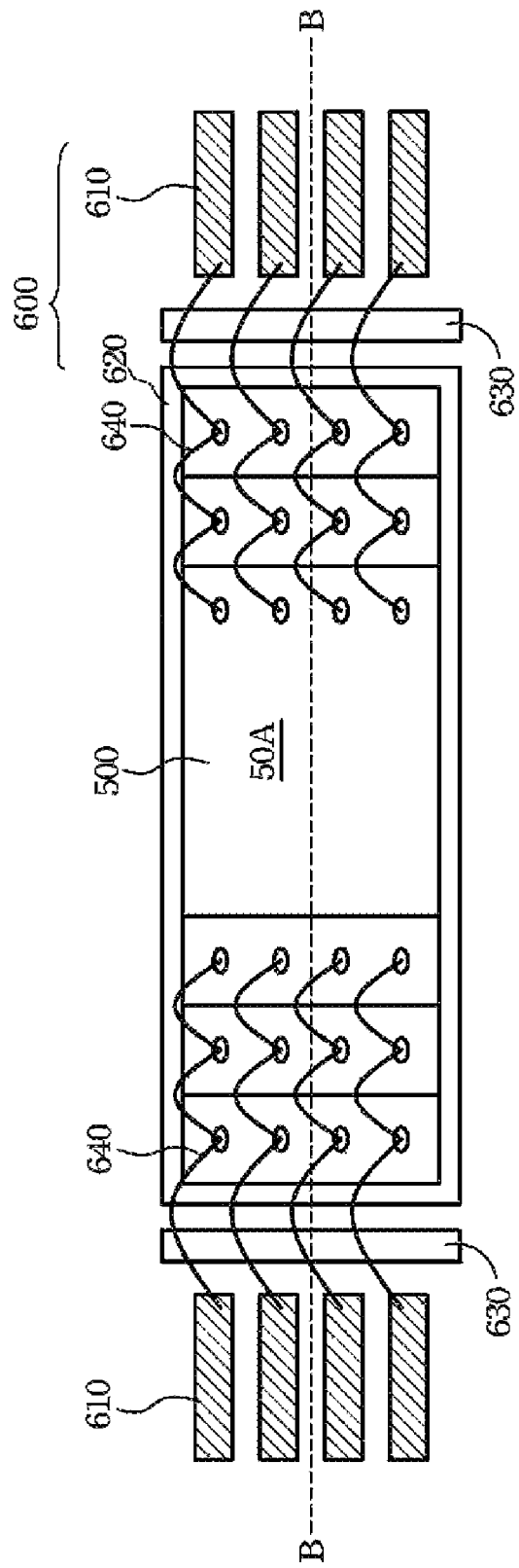
FIG. 9 is a top view of a zigzag-stacked structure with a bus bar in another embodiment of the present invention.

FIG. 9 is a plan view showing a zigzag-stacked package structure according to another embodiment of the present invention. As shown in FIG. 9, the zigzag-stacked package structure includes lead frame 600 and a zigzag-stacked structure 50A. The lead frame 600 includes a plurality of inner leads 610, a plurality of outer leads (not shown), at least one bus bar 630 and a die paddle 620. Compared to the zigzag-stacked package structure shown in FIG. 7, the difference is that the lead frame 600 of the zigzag-stacked package structure in this embodiment further includes the bus bar 630.

The bus bar 630 disposed between the die paddle 620 and the corresponding inner leads 610. The bus bar 630 of the lead frame 600 can be at the same height as the die paddle 620 or the inner leads 610 or at a height between the die paddle 620 and the inner leads 610. The bus bar 630 is formed in a bar-like arrangement or ring-like arrangement. The bus bar 630 is also included in prior art, and the detailed description is omitted.

Figure 10:
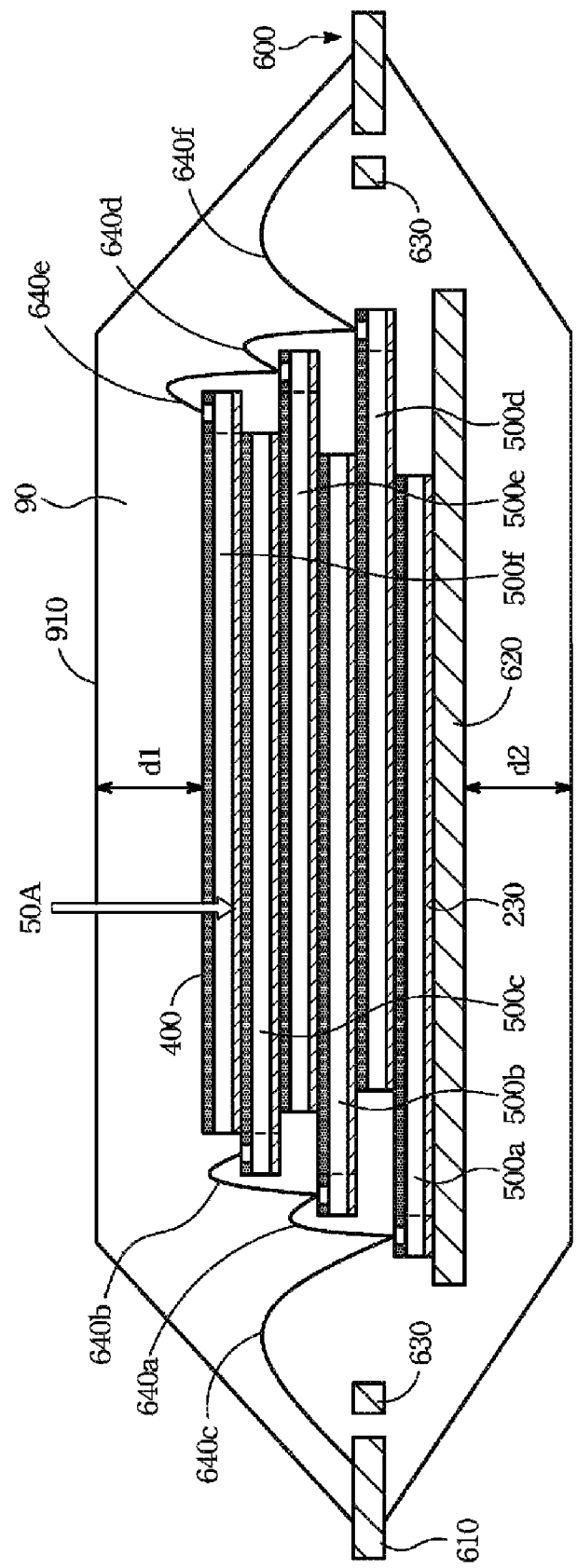
FIG. 10 is a sectional view of a zigzag-stacked package structure with a bus bar in another embodiment of the present invention.

FIG. 10 is a sectional view of a zigzag-stacked package structure with a bus bar according to the present invention (according to the section line BB in FIG. 9). As shown in FIG. 10, the lead frame 600 is connected with six dies 500 to form the zigzag-stacked package structure and is electrically connected by a plurality of wires 640. The lead frame 600 includes a plurality of inner leads 610, a plurality of outer leads (not shown) and a die paddle 620. The die paddle 620 is disposed between the inner leads 610 and a height difference is formed between the die paddle 620 and the inner leads 610. The bus bar 630 is disposed between the inner lead 610 and the die paddle 620. The dies 500*a*, 500*b*, 500*c*, 500*d*, 500*e* and 500*f* are connected to the lead frame 600 by the wires 640*a*, 640*b*, 640*c*, 640*d*, 640*e* and 640*f* as described in FIG. 8. The material of the wires 640 is gold but not limited to. Besides, the lead frame 600 in the embodiment includes a bus bar 630 and the bus bar 630 is at the same height as the inner lead 610. Therefore, during the connection steps of the wires 640, for some electrical requirements, some of the wires 640 are optionally connected to the bus bar 630. Therefore, the bus bar 630 of the lead frame 600 can serve as a power connection, a ground or a shared signal connection. The bus bar 630 is useful in circuit design to provide flexibility. The bus bar 630 is disclosed in prior art, and the detailed description is omitted.

At last, the encapsulated material 90 is formed by the molding process described in FIG. 8. The vertical distance (d1) between the top edge surface 910 of the encapsulated material 90 and the die 500f and the vertical distance (d2) between the bottom edge of the die paddle 620 and the bottom edge of the encapsulated material 90 are the same. During the molding process, the molding flow on the die 500f and the bottom edge of the die paddle 620 are almost the same to form the balanced package structure in this embodiment.

Figure 11:
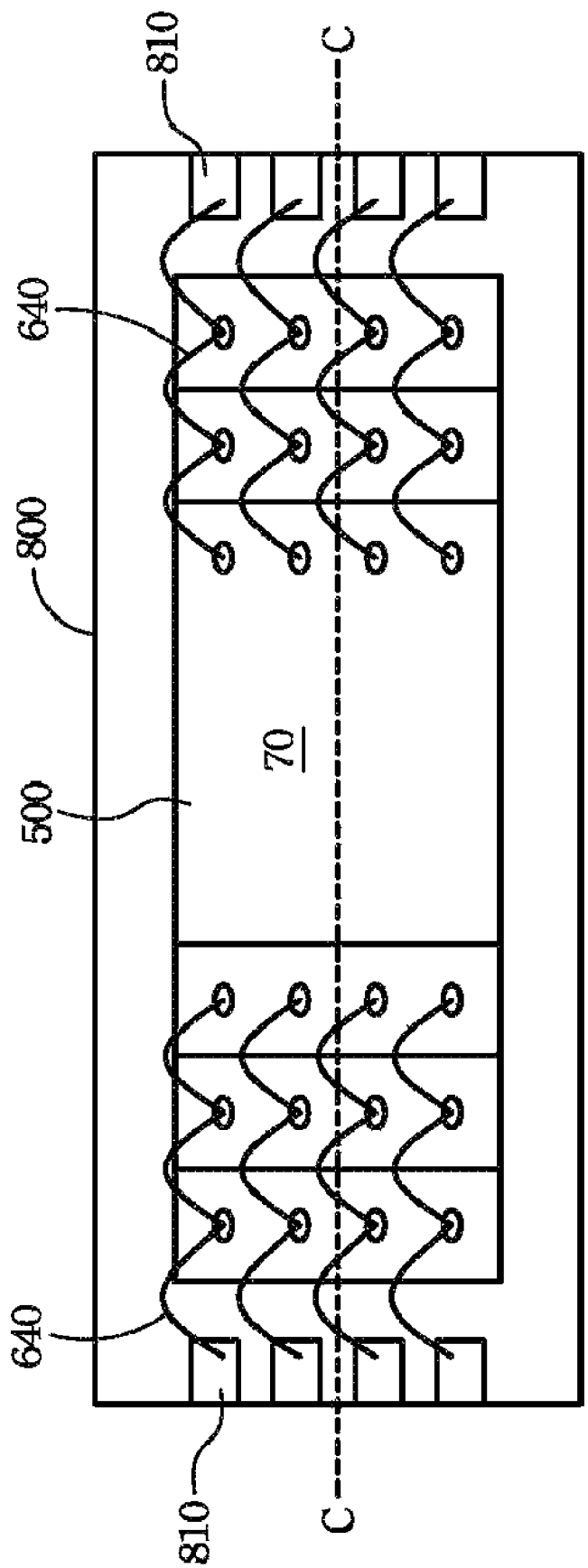
FIG. 11 is top view of a zigzag-stacked structure in another embodiment of the present invention.

FIG. 11 is a plan view showing another embodiment showing a zigzag-stacked package structure of the present invention. As shown in FIG. 11, the zigzag-stacked package structure includes a substrate 800 and the zigzag-stacked structure 70. The substrate 800 is used to support the zigzag-stacked structure (30, 50, 50A or 70). The wires 640 are used to electrically connect the zigzag-stacked structure 70 to the metal ends 810 on the substrate 800 for further external connection. The adhesive material 230 described above is also used to attach the zigzag-stacked structure 70 and the substrate 800. The substrate 800 is a printed circuit board (PCB), ceramic substrate or a substrate with a core layer made by BT resin or FR-4 resin. Besides, in order to connect to the external components, the reverse surface of the substrate 800 opposite to the surface with the zigzag-stacked structure 70 mounted on also includes the metal ends 810 disposed thereon and electrically connected to the metal ends 810 on the surface with the zigzag-stacked structure 70 mounted on by redistribution layer (RDL) or through-hole process. The solder balls can be attached to metal ends 810 on the reverse surface as the external connections of the package structure, such as a ball grid array (BGA) package structure. Obviously, the pads on the dies unshadowed by any of the dies on top in the zigzag-stacked package structure of the present invention. After all the dies are mounted on the substrate 800, the wire bonding process is then executed so as to simplify the package procedures.

Figure 12:
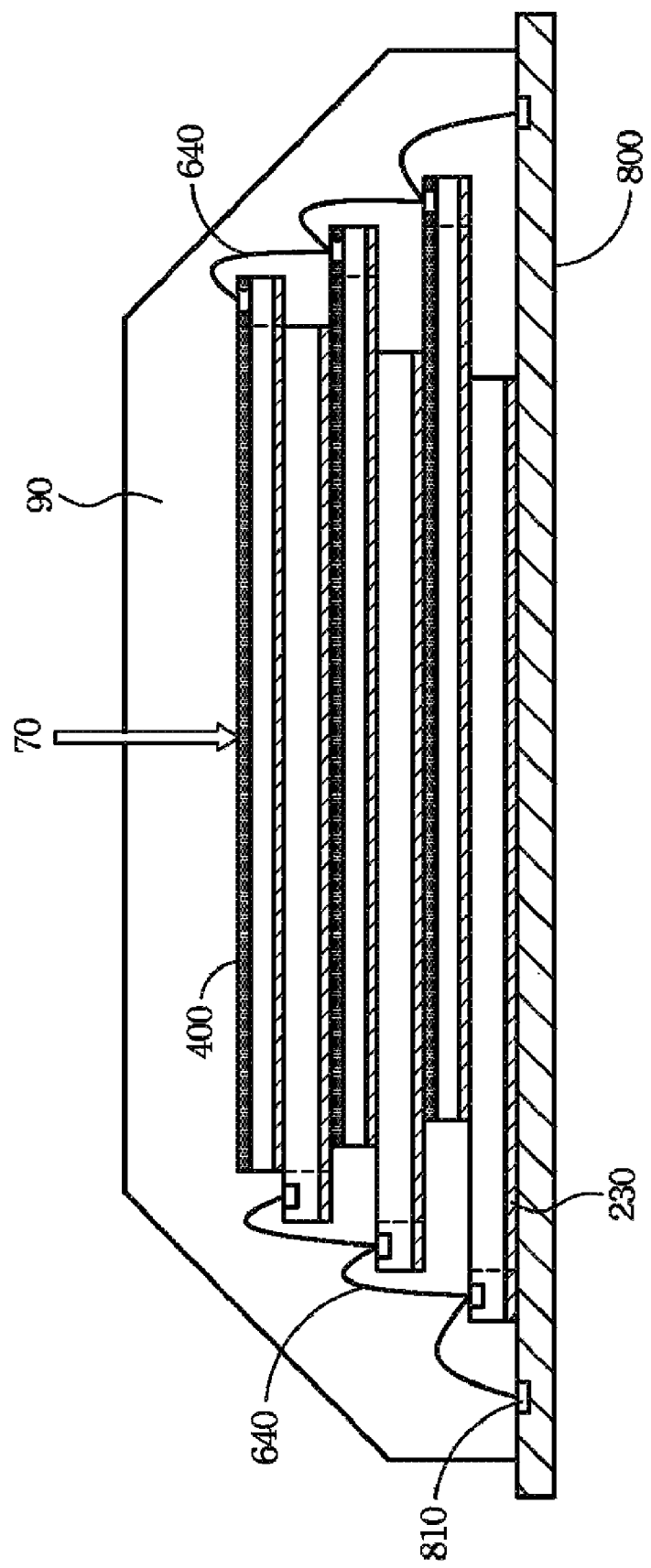
FIG. 12 is a sectional view of a zigzag-stacked package structure in another embodiment of the present invention.

FIG. 12 is a section view showing a zigzag-stacked package structure of the present invention (according to the sectional line CC in FIG. 11). As shown in FIG. 12, a plurality of the wires 640 are used to connect the substrate 800 and the zigzag-stacked structure 70. The wires 640 are used to electrically connect the dies 500 and 20 of the zigzag-stacked structure 70 to the metal ends 810 on the substrate 800. The material of the wires 640 is gold but not limited to. The encapsulated material 90 is formed to cover the zigzag-stacked structure 70, the wires 640 and the substrate 800.

What is claimed is:
1. A zigzag-stacked package structure comprising:
a lead frame including a plurality of inner leads, a plurality of outer leads and a die paddle, wherein the die paddle is disposed between the plurality of inner leads and a height difference is formed between the die paddle and the plurality of inner leads;
a zigzag-stacked structure fixedly connected on the die paddle, the zigzag-stacked structure including a plurality of first dies and a plurality of second dies, each of the plurality of first dies and the plurality of second dies having an active surface and a back surface opposite to the active surface, a first periphery region and a second periphery region opposite to the first periphery region defined upon each active surface, wherein each of the plurality of first dies and each of the plurality of second dies are alternately stacked to each other with the back surface attached to the active surface and forming a stacked area, and the plurality of first dies and the plurality of second dies are electrically connected to the plurality of inner leads, and dimensions of the stacked area formed by the plurality of first dies and the plurality of second dies of the zigzag-stacked structure alternately are upwardly increasing;

an encapsulated material covering the zigzag-stacked structure and the lead frame, and the plurality of outer leads are extended outside the encapsulated material;

wherein each of the plurality of first dies has a plurality of pads disposed on the first periphery region and each of the plurality of second dies has a plurality of pads disposed on the second periphery region, and each of the plurality of pads is exposed and unshadowed by any one of the plurality of first dies and the plurality of second dies placed above.

2. The package structure of claim 1, wherein each of the plurality of first dies and each of the plurality of second dies in the zigzag-stacked structure comprises:

a die body including a wire bonding region defined in one of the periphery region, a plurality of first pads disposed within the wire bonding region and a plurality of second pads disposed outside of the wire bonding region;

a first protective layer disposed on the die body, wherein the first protective layer includes a plurality of first openings to expose the plurality of first pads and the plurality of second pads;

a redistribution layer disposed on the first protective layer, wherein the redistribution layer is extended from the plurality of second pads to the wire bonding region, the redistribution layer includes a plurality of third pads disposed within the wire bonding region; and a second protective layer covering on the redistribution layer, wherein the second protective layer includes a plurality of second openings to expose the plurality of first pads and the plurality of third pads.

3. The package structure of claim 1, wherein the dimension of the stacked area formed by two bottom dies of the zigzag-stacked structure is larger than one half of a dimension of either one of the two bottom dies.

4. The package structure of claim 1, wherein the lead frame further comprising at least one bus bar disposed between the plurality of inner leads and the die paddle.

5. The package structure of claim 4, wherein the bus bar and the die paddle are in the same plane surface.

6. The package structure of claim 4, wherein the bus bar and the plurality of inner leads are in the same plane surface.

7. The package structure of claim 4, wherein the bus bar, the plurality of inner leads and the die paddle form a height difference.

8. A zigzag-stacked package structure comprising:

a substrate including a plurality of metal ends disposed thereon; and a zigzag-stacked structure fixedly connected on the substrate, the zigzag-stacked structure including a plurality of first dies and a plurality of second dies, each of the plurality of first dies and the plurality of second dies having an active surface and a back surface opposite to the active surface, a first periphery region and a second periphery region opposite to the first periphery region defined upon each active surface, wherein each of the plurality of first dies and each of the plurality of second dies are alternately stacked to each other with the back surface attached to the active surface and forming a stacked area, and the plurality of first dies and the plurality of second dies are electrically connected to the metal ends on the substrate, and dimensions of the stacked area formed by the plurality of first dies and the plurality of second dies of the zigzag-stacked structure alternately are upwardly increasing;

wherein each of the plurality of first dies has a plurality of pads disposed on the first periphery region and each of the plurality of second dies has a plurality of pads disposed on the second periphery region, each of the plurality of pads is exposed and unshadowed by any one of the plurality of first dies and the plurality of second dies placed above.

9. The package structure of claim 8, wherein each of the plurality of first dies and the plurality of second dies in the zigzag-stacked structure comprises:

a die body including a wire bonding region defined in one of the periphery region, and a plurality of first pads disposed within the wire bonding region and a plurality of second pads disposed outside of the wire bonding region;

a first protective layer disposed on the die body, wherein the first protective layer includes a plurality of first openings to expose the plurality of first pads and the plurality of second pads;

a redistribution layer disposed on the first protective layer, wherein the redistribution layer is extended from the plurality of second pads to the wire bonding region, the redistribution layer includes a plurality of third pads disposed within the wire bonding region; and a second protective layer covering on the redistribution layer, wherein the second protective layer includes a plurality of second openings to expose the plurality of first pads and the plurality of third pads.

10. The package structure of claim 8, wherein the dimension of the stacked area formed by two bottom dies of the zigzag-stacked structure is larger than one half of a dimension of either one of the two bottom dies.

* * * * *